(12) United States Patent
Molloy et al.

(10) Patent No.: US 9,230,851 B2
(45) Date of Patent: Jan. 5, 2016

(54) REDUCTION OF POLYSILICON RESIDUE IN A TRENCH FOR POLYSILICON TRENCH FILLING PROCESSES

(71) Applicant: Texas Instruments Incorporated, Dallas, TX (US)

(72) Inventors: Simon John Molloy, Allentown, PA (US); Christopher Boguslaw Kocon, Mountain Top, PA (US); John Manning Savidge Neilson, Norristown, PA (US); Hong Yang, Richardson, TX (US); Seetharaman Sridhar, Richardson, TX (US); Hideaki Kawahara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/175,488

(22) Filed: Feb. 7, 2014

(65) Prior Publication Data

US 2014/0220761 A1    Aug. 7, 2014

Related U.S. Application Data

(60) Provisional application No. 61/762,189, filed on Feb. 7, 2013.

(51) Int. Cl.
*H01L 21/336* (2006.01)
*H01L 21/763* (2006.01)
*H01L 29/66* (2006.01)

(52) U.S. Cl.
CPC ........ *H01L 21/763* (2013.01); *H01L 29/66348* (2013.01)

(58) Field of Classification Search
None
See application file for complete search history.

(56) References Cited

U.S. PATENT DOCUMENTS

| 2009/0057756 | A1  | 3/2009  | Hshieh |
|---|---|---|---|
| 2010/0207205 | A1* | 8/2010  | Grebs ............... H01L 23/544 257/334 |
| 2011/0298042 | A1* | 12/2011 | Tu ................... H01L 29/0634 257/330 |
| 2012/0235229 | A1* | 9/2012  | Probst ............... H01L 29/401 257/330 |
| 2012/0326227 | A1* | 12/2012 | Burke ............... H01L 29/407 257/330 |
| 2013/0193502 | A1  | 8/2013  | Kocon et al. |

* cited by examiner

*Primary Examiner* — Benjamin Sandvik
*Assistant Examiner* — Herve Assouman
(74) *Attorney, Agent, or Firm* — Tuenlap D. Chan; Frank D. Cimino

(57) ABSTRACT

A method of fabricating a semiconductor device includes forming at least one trench from a top side of a semiconductor layer, wherein the trench is lined with a trench dielectric liner and filled by a first polysilicon layer. The surface of the trench dielectric liner is etched, wherein dips in the trench dielectric liner are formed relative to a top surface of the first polysilicon layer which results in forming a protrusion including the first polysilicon layer. The first polysilicon layer is etched to remove at least a portion of the protrusion. A second dielectric layer is formed over at least the trench after etching the first polysilicon layer. A second polysilicon layer is deposited. The second polysilicon layer is etched to remove it over the trench and provide a patterned second polysilicon layer on the top side of the semiconductor layer.

12 Claims, 5 Drawing Sheets

REDUCTION OF POLYSILICON RESIDUE IN A TRENCH FOR POLYSILICON TRENCH FILLING PROCESSES

CROSS REFERENCE TO RELATED APPLICATIONS

This application claims the benefit of Provisional Application Ser. No. 61/762,189 entitled "REDUCTION OF RESIDUE IN POLYSILICON TRENCH FILLING PROCESS", filed Feb. 7, 2013, which is herein incorporated by reference in its entirety.

FIELD

Disclosed embodiments relate to discrete devices or integrated circuits having polysilicon filled trenches and a later formed second polysilicon layer used at a separate polysilicon level.

BACKGROUND

Some processes include the formation of polysilicon filled dielectric lined trenches. For example, polysilicon filled dielectric lined trenches can be used for dielectric isolation (e.g., shallow trench isolation (STI)), for making capacitors, or for making both. Some of these trenches are deep trenches, typically formed by reactive ion etching (RIE), which can be 10 μm to 50 μm deep, or more. Several of these processes add a polysilicon gate for metal-oxide-semiconductor field-effect transistor (MOSFET) devices and/or other polysilicon filled trenches, so that there are two levels of polysilicon trench filling.

For example, certain MOSFETs have a gate structure including polysilicon gate electrodes and a vertical drain drift region between RESURF trenches which are polysilicon filled regions. For the purposes of this application, the term "RESURF" is understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

There can be active area RESURF trenches (hereafter "active area trenches") which contain field plates which are electrically coupled to a source of the MOSFET. In the case of a n-channel MOSFET, there is a p-body region within an n-drift region on a substrate, where n-type dopants are in the source regions formed in the p-body region. The drain for the MOSFET can be a vertical drain drift region that uses the entire n-drift region below the p-body region, that has a drain contact on the bottom of the substrate which can be an n+ substrate.

A contact metal stack makes electrical contact with the source regions at lateral sides of the contact structure, makes electrical contact with a body contact region at a bottom surface of the contact structure, and makes electrical contact to the field plates in the active area trenches at the bottom surface of the contact structure. A perimeter RESURF trench (hereafter a "termination trench") surrounds the MOSFET, including the active area trenches. The termination trench is formed at a first polysilicon level and the active area trenches include formation steps including a second polysilicon level, creating the need to remove the second polysilicon layer from over the termination trench.

SUMMARY

Disclosed embodiments include in one embodiment a method of forming a semiconductor device including forming at least one trench from a top side of a semiconductor surface, wherein the trench is lined with a trench dielectric liner and filled by a first polysilicon layer. The trench dielectric liner is etched, wherein dips in the trench dielectric liner are formed relative to a top surface of the first polysilicon layer which form a protrusion including the first polysilicon layer. The first polysilicon layer is etched to remove at least a portion of the protrusion. A second dielectric layer is formed over the trench after etching the first polysilicon layer. A second polysilicon layer is then deposited.

The second polysilicon layer is etched to provide a patterned second polysilicon layer on the top side of the semiconductor surface. The removal of the protrusion has been found to avoid (or at least significantly reduce) formation of second polysilicon residue in the dips created by the trench dielectric liner etch, which provides benefits including a higher breakdown voltage over the termination trench and improved device reliability for certain process flows. For example, an example process flow is described below for forming an n-channel MOSFET device including a termination trench having a field plate surrounding active area trenches having field plates for MOS gates between the field plates of the active area trenches, where polysilicon protrusions are formed in the termination trench which can be removed by disclosed embodiments.

BRIEF DESCRIPTION OF THE DRAWINGS

Reference will now be made to the accompanying drawings, which are not necessarily drawn to scale, wherein.

DETAILED DESCRIPTION

Figure 1:
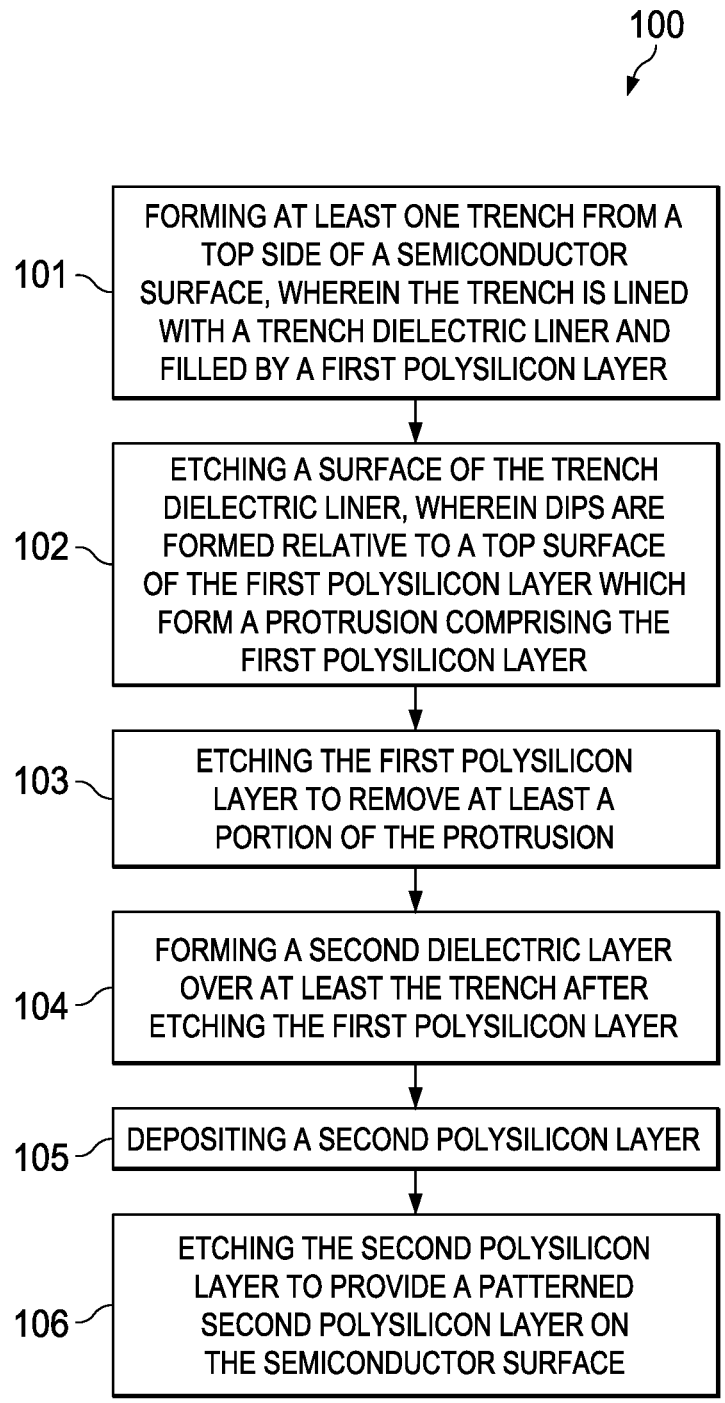
FIG. 1 is a flow chart that shows steps in an example method of forming a semiconductor device using a process including first and second polysilicon layers and mask levels, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of forming a semiconductor device using a process including first and second polysilicon mask levels, according to an example embodiment. Step 101 comprises forming at least one trench from a top side of a semiconductor surface, wherein the trench once formed is lined with a trench dielectric liner and then filled by a first polysilicon layer. In one embodiment the trench dielectric liner can comprise a relatively thin thermal silicon oxide layer (e.g., 50 nm to 100 nm) followed by a relative thick deposited dielectric layer (200 nm to 400 nm of deposited silicon oxide).

The trench(es) is typically 2 µm to 20 µm deep, being at the deeper end of this range for higher voltage devices. A typical semiconductor device that may utilize disclosed trenches uses an operating voltage range of 20V to 200V, such as semiconductor device 350 shown in FIG. 3B described below. The substrate 107 and/or semiconductor surface 108 can comprise silicon, silicon-germanium, or other semiconductor material. In one particular arrangement the semiconductor surface 108 is epitaxially oriented relative to the substrate 107, such as an n⁻ epitaxial layer on an n+ substrate for NMOS, or as p– epitaxial layer on a p+ substrate for PMOS. Another example is a silicon/germanium (SiGe) semiconductor surface 108 epitaxially grown on a silicon substrate 107.

The trench dielectric liner can comprise silicon oxide, or another dielectric material such as silicon nitride or silicon oxynitride, or a metal comprising high-k dielectric (k>5) material such as $HfO_2$. The first polysilicon layer is generally doped (e.g. n+), which can be doped in-situ with the polysilicon deposition, or deposited undoped and then ion implanted with one or more dopant ions.

Method 100 for a device including both a termination trench and active area trenches can include an additional masking level after step 101 (and before step 102 described below) comprising masking the termination trench and etching the first polysilicon layer in the active area including a portion of the first polysilicon layer in the active trenches. In one embodiment, the first polysilicon layer remaining in the active trenches can be from 30% to 70% of the depth of the trench. Subsequent filling of the active area trenches with a second polysilicon layer described below (step 105) results in a structure (see FIG. 2E described below) which can increase the breakdown voltage of the active area trenches.

Step 102 comprises etching a surface of the trench dielectric liner, wherein dips are formed relative to a top surface of the first polysilicon layer which forms a protrusion comprising the first polysilicon layer in the trench. See, for example, dips 191 in the trench dielectric liner 118 on respective sides of a field plate comprising the first polysilicon layer 120 shown in FIG. 2A described below.

Step 103 comprises etching the first polysilicon layer to remove at least a portion of the protrusion, and generally the entire protrusion. Step 103 is a new flow step that has been found to avoid formation of second polysilicon residue in the dips 191 shown in FIG. 2A since the first polysilicon protrusion can be eliminated (step 103). The etching of the first polysilicon layer can comprise reactive ion etching (RIE), plasma etching, or wet chemical etching such as using a tetra methyl ammonium hydroxide (TMAH) solution.

Step 104 comprises forming a second dielectric layer over at least the trench after etching the first polysilicon layer. The forming of the second dielectric layer is generally a blanket deposition, and the second dielectric layer can comprise silicon oxide or silicon nitride.

Step 105 comprises depositing a second polysilicon layer. A typical thickness range for the second polysilicon layer can be between 0.5 µm to 2 µm. Since the first polysilicon protrusion is generally eliminated, or is at least largely eliminated (step 103), the second polysilicon layer does not form "dog ears" in the dips 191 upon deposition that would otherwise be present at this step. The second polysilicon layer can be deposited by Low Pressure Chemical Vapor Deposition (LPCVD), or Plasma Enhanced CVD (PECVD).

The second polysilicon layer is generally doped, and can be doped in-situ with the polysilicon deposition, or deposited undoped and then ion implanted with one or more dopant ions. In some embodiments portions of the second polysilicon layer are doped p-type, and some portions are doped n-type. In one embodiment, the second polysilicon layer is also used to form additional trenches, such as active area trenches described below.

Step 106 comprises etching the second polysilicon layer including over the termination trench to provide a patterned second polysilicon layer on the semiconductor surface. This step is can be unmasked etch or a masked etch. The resulting second polysilicon layer after patterning is generally in an active area of the semiconductor device, including filling the top of the active area trenches for a device including both a termination trench and active area trenches.

Regarding the unmasked etch embodiment of the second polysilicon layer, the second polysilicon layer can be patterned by a blanket etch back step. The second polysilicon layer is thicker in the areas over trenches by the nature of chemical vapor deposition (CVD) processing generally used to deposit polysilicon. Accordingly, one can etch back the second polysilicon layer to the semiconductor surface, leaving the second polysilicon layer approximately level with the original semiconductor surface. There is typically an oxide (or other dielectric) layer on the semiconductor surface that acts as an etch stop. Accordingly, with a controlled overetch, the second polysilicon layer can be cleared from the original semiconductor surface with no need for lithography.

Disclosed polysilicon filled dielectric lined trenches can be used for field plates, or for making capacitors, or for both, separately or together. Disclosed polysilicon filled dielectric lined trenches may also be used as trench gates for trench gate devices, such as trenchFETs.

FIGS. 2A-D are cross-sectional depictions showing processing progression for an example method of forming a semiconductor device having polysilicon filled deep trenches, described as being termination trench, according to an example embodiment. Active area trenches within an active area of the device are also being formed. The method utilized being described for FIGS. 2A-2E includes the additional masking level described above after step 101 and before step 102 which enables the active area trenches to be filled with a second polysilicon layer on a first polysilicon layer, while the termination trench is filled with only the first polysilicon layer.

Figure 2A:
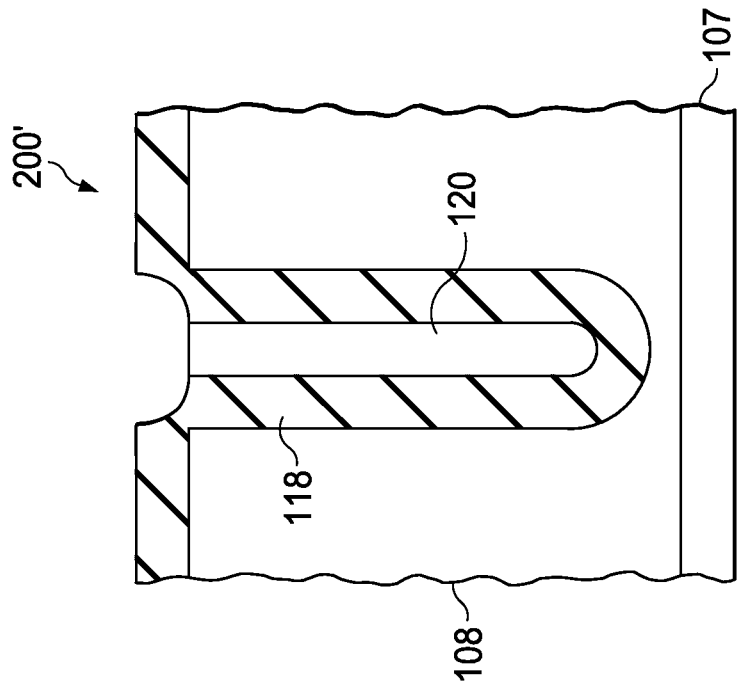
FIGS. 2A-D are cross-sectional depictions showing process progression for an example method of forming a semiconductor device having polysilicon filled trenches, according to an example embodiment.

The in-process termination trench shown as 200 in FIG. 2A is shown after step 102 comprising etching a surface of the trench dielectric liner 118, wherein dips 191 in the trench dielectric liner 118 are formed relative to a top surface of the first polysilicon layer 120 which forms a protrusion comprising the first polysilicon layer 120.

As noted above, the trench dielectric liner 118 although shown as a single layer in FIG. 2A and the other FIGs., can be a relatively thin thermally grown silicon oxide layer with a relatively thick deposited dielectric layer thereon. The termination trench 200 is shown formed in a semiconductor surface 108 that is on a substrate/bottom layer 107. In one particular embodiment (See FIGS. 3A and 3B described below), the semiconductor surface 108 comprises an n-drift region and the substrate/bottom layer 107 is an n+ drain contact region of an NMOS FET.

Figure 2B:
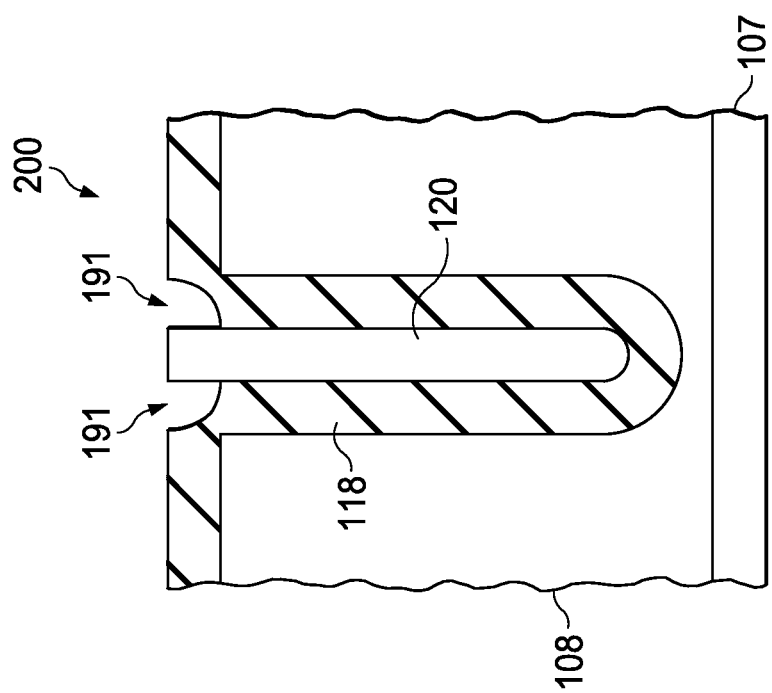

FIG. 2B is shown after step 103 comprising etching the first polysilicon layer 120 to remove at least a portion of the protrusion. The protrusion in FIG. 2A is shown completely removed in FIG. 2B, with the protrusion-less polysilicon termination trench shown as 200' in FIG. 2B. Step 103 is implemented to provide extra first polysilicon etching before the second dielectric (e.g., TEOS) deposition (step 104) and provide a smoothened topology for the second polysilicon deposition/fill (step 105) and subsequent second polysilicon etching over the termination trench with minimized second polysilicon residue concern.

Figure 2C:
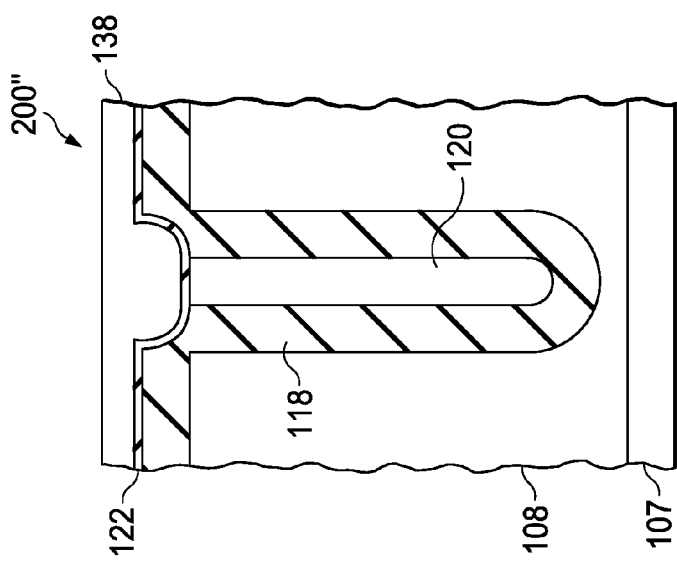

FIG. 2C is shown after step 104 comprising depositing a second dielectric layer 122 over at least the termination trench after etching the first polysilicon layer 120 (step 103), and then depositing a second polysilicon layer 138 (step 105). The termination trench is shown as 200" in FIG. 2C. FIG. 2E is a cross-sectional depiction of an in-process active area trench 250 having the second polysilicon layer 138 on the first polysilicon layer 120, which is within an active area of the device when the in-process termination trench has the structure shown as 200" in FIG. 2C.

Figure 2D:
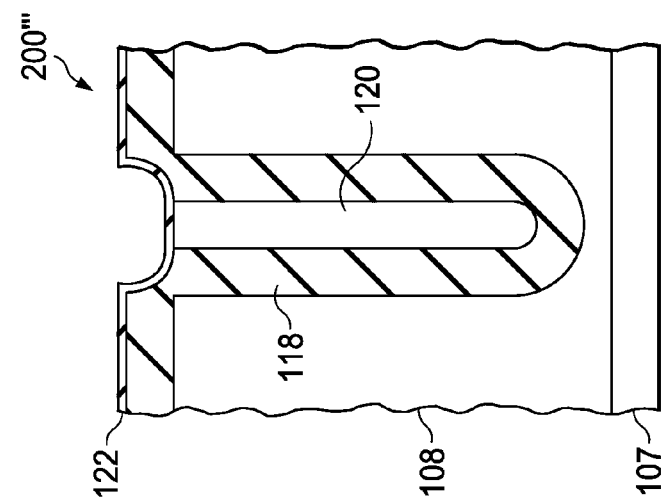
Figure 2E:
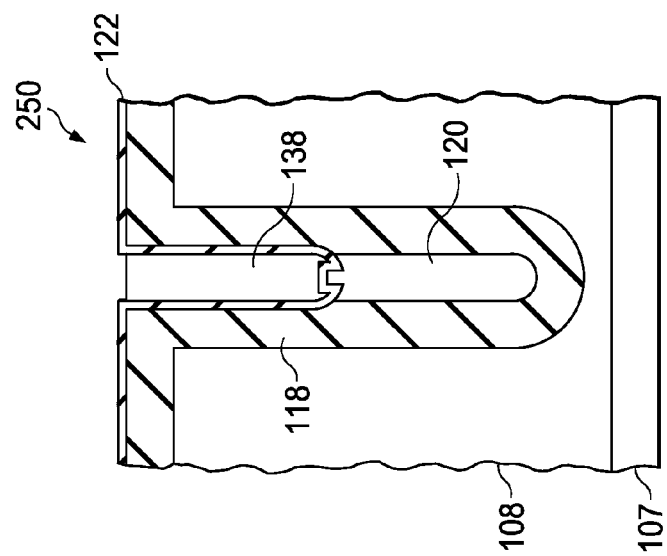
FIG. 2E is a cross-sectional depiction of an in-process active area trench having first and second polysilicon layers as it is on the substrate (e.g., wafer) when the in-process termination trench has the structure shown in FIG. 2C.

FIG. 2D is shown after step 106 comprising etching the second polysilicon layer (shown in FIG. 2C as 138) including over the termination trench to provide a patterned second polysilicon layer on the top side of the semiconductor surface 108. The resulting termination trench is shown as 200'" in FIG. 2D.

Applicants note that active area trenches such as active area trench 250 shown in FIG. 2E can also benefit from method 100. Method 100 including the optional masking level describe above between step 101 and 102 can help by smoothing out the surface of the first polysilicon layer 120 that is exposed inside the active trench regions. Smoothing reduces corners, improves the second dielectric layer (e.g., TEOS derived silicon oxide) step coverage, and thus provide a more robust second dielectric layer isolation (which increases the breakdown voltage).

Figure 3A:
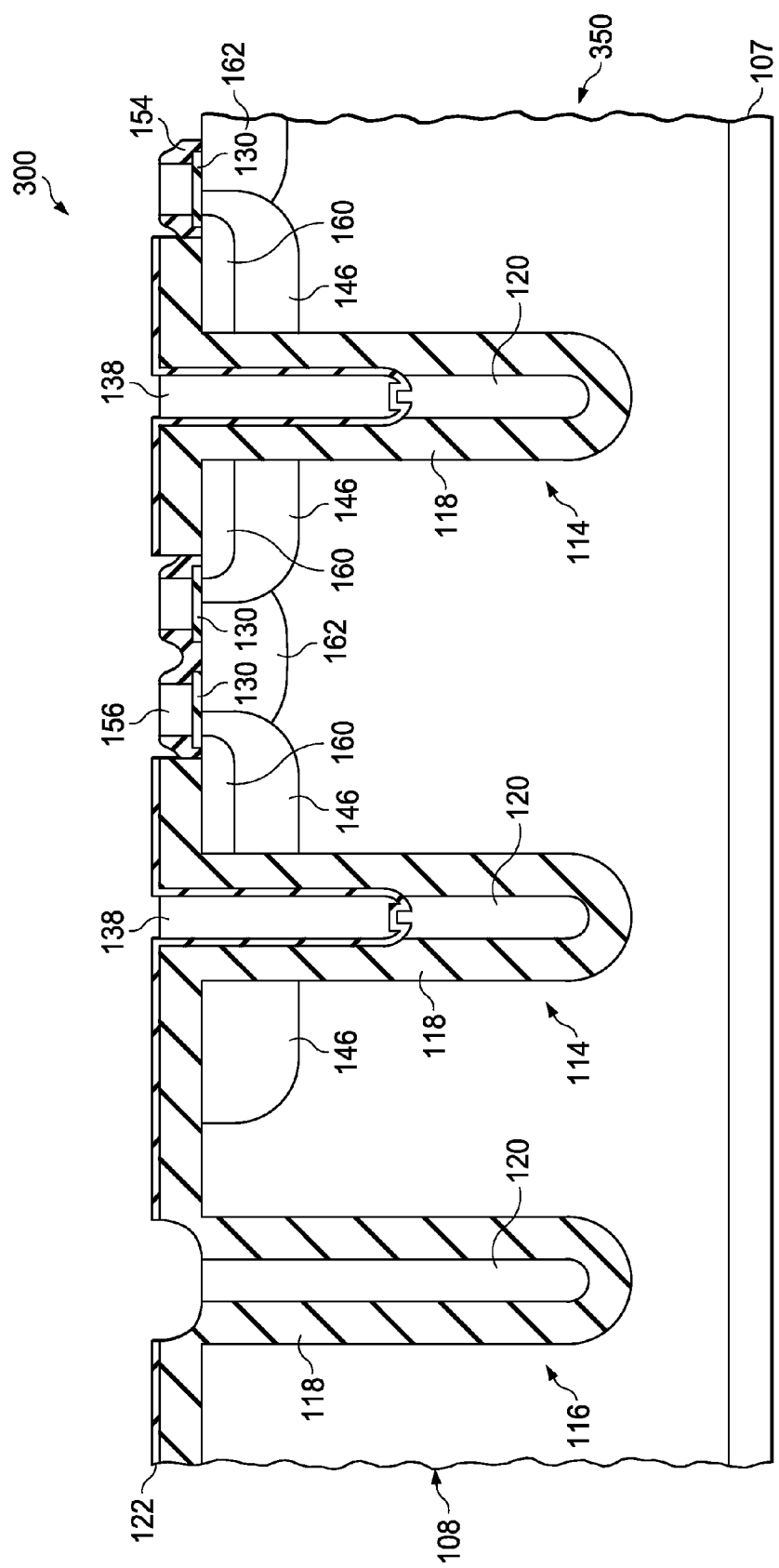
FIG. 3A is a cross sectional view of an example semiconductor device comprising a MOSFET device including a termination trench surrounding the MOSFET including an active area including a plurality of active area trenches, according to an example embodiment.
Figure 3B:
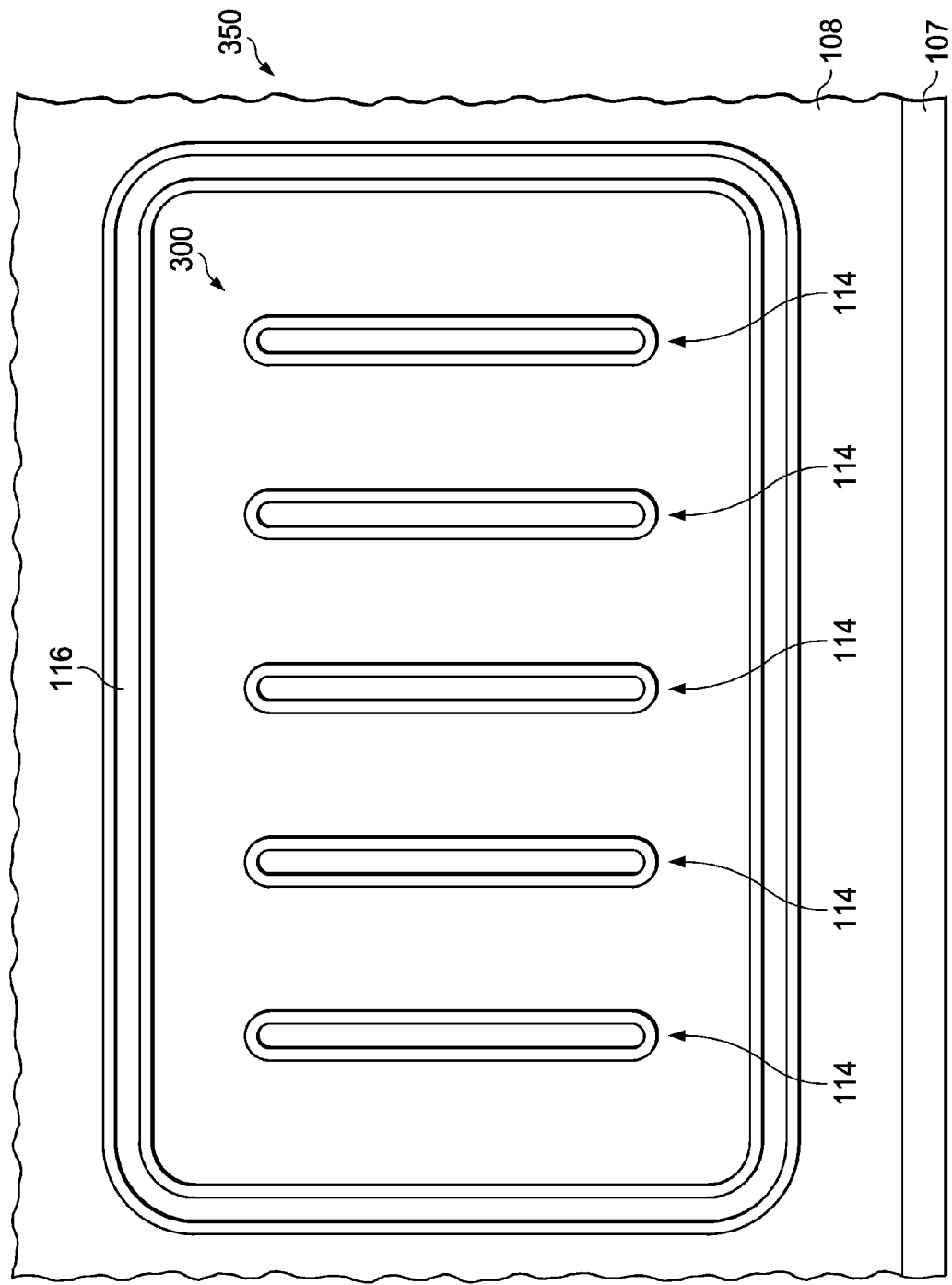
FIG. 3B is a top view of the MOSFET device shown in FIG. 3A showing the termination trench surrounding the MOSFET's active area trenches.

FIG. 3A is a cross sectional view of an example semiconductor device 350 having a MOSFET device 300 described as being NMOS including a disclosed termination trench surrounding the MOSFET device 300 including an active area including a plurality of active area trenches, according to an example embodiment. FIG. 3B is a top view of the MOSFET device 300 shown in FIG. 3A showing the termination trench surrounding the MOSFET device. The termination trench 116 in FIG. 3A can be seen to include the dips in the trench dielectric liner 118 shown as 191 in FIG. 2A (as well as FIGS. 2B-2D although not numbered) on respective sides of the first polysilicon layer 120. Two example active area trenches 114 are shown in FIG. 3A that are within the surrounding termination trench 116 which have the structure shown in FIG. 2E (with the second polysilicon layer 138 on the first polysilicon layer 120) in active area trench 250.

The MOSFET 300 of FIG. 3A corresponds to FIG. 1P in U.S. application Ser. No. 13/744,097 to Kocon et al. with modifications including disclosed trench modifications and simplification by removing both the dielectric, top side contacts and metal over the device, hereafter the '097 application, where Kocon is one of the inventors of this application as well. This application incorporates the '097 application by reference in its entirety. Although a split gate including gate electrodes 156 comprising a third polysilicon layer is shown in FIG. 3A, a split gate is an optional feature for MOSFET device 300. The '097 application refers to a "perimeter RESURF trench" which as noted above corresponds with a "termination trench" as otherwise used herein, and the '097 application refers to "active area trench RESURF trenches" which as noted above corresponds with "active area trenches" as used otherwise herein.

There is shown an n− drift region 108 on a substrate 107. N-drift region 108 can be an epitaxial layer. A p-body region is shown as 146 abutting the active area trenches 114. N-type dopants are shown in the n-type source regions 160 formed in the p-body 146, and in the n-type (lightly doped drain) LDD regions shown as 162. The drain for the MOSFET 300 can be a vertical drain drift region that uses the entire n− drift region 108 below the p-body region 146 (and thus has no reference number shown in FIG. 3A), which has a drain contact on the bottom of the substrate 107 that can be an n+ substrate.

The gate dielectric layer is shown as 130. A patterned third polysilicon layer is shown providing gate electrodes 156 over the gate dielectric layer 130. The trench dielectric liner 118 is under the second dielectric layer 122. The third polysilicon layer for the gate electrode 156 may include 100 to 200 nanometers of polysilicon and possibly a layer of metal silicide (not shown) on the polysilicon, such as 100 to 200 nanometers of tungsten silicide. Other materials for the gate electrode 156 are within the scope of this disclosure.

FIG. 3B corresponds to FIG. 2A in the '097 application with minor modification. Referring to FIG. 3B, the semiconductor device 350 is formed in and on the semiconductor surface 108. The MOSFET 300 contains a plurality of active area trenches 114, where MOS devices (such as shown in FIG. 3A) that are between positioned between adjacent active area trenches 114 are not shown for simplicity. A termination trench 116 is shown surrounding the MOSFET 300 and its active area trenches 114. The active area trenches 114 and the termination trench 116 both include field plates comprising the first polysilicon layer 120 as described above and shown in FIG. 3A, with the active area trenches 114 also including the second polysilicon layer 138. Although not shown in FIG. 3B, the termination trench 116 can be connected to at least one instance of the active area trenches 114 so that the field plate in the termination trench 116 is electrically connected to the field plate in at least one active transistor trench 114.

For disclosed embodiments analogous to processes forming semiconductor device 350 having a MOSFET device 300, the breakdown voltage to the terminating trench is improved by typically eliminating second polysilicon layer residue which is recognized to cause localized lower breakdown voltage. Eliminating second polysilicon residue in the terminating trenches also allows one to thin the trench dielectric liner 118 and use a lower resistance n− drift region/semiconductor surface 108 (e.g., a more highly doped silicon surface). This improves device performance while maintaining breakdown voltage. The reliability of disclosed devices is also expected to be improved by a more conformal second dielectric layer 122 over the termination trench.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, MOSFET device 300 described above as being NMOS, may be made to be PMOS by appropriate changes in dopant polarities and conductivity types.

The invention claimed is:

1. A method of fabricating a semiconductor device, comprising:
- forming at least one trench from a top side of a semiconductor surface, wherein said trench is lined with a trench dielectric liner and filled by a first polysilicon layer;
- etching a surface of said trench dielectric liner, wherein dips are formed relative to a top surface of said first polysilicon layer which form a polysilicon protrusion comprising said first polysilicon layer;
- etching said first polysilicon layer to remove at least a portion of said polysilicon protrusion;
- forming a second dielectric layer over at least said trench after etching said first polysilicon layer;
- depositing a second polysilicon layer, and
- etching said second polysilicon layer to remove said second polysilicon layer over said trench and provide a patterned second polysilicon layer without substantially recessing from said top side of said semiconductor surface.

2. The method of claim 1, wherein said etching said first polysilicon layer comprises reactive ion etching (RIE), plasma etching, or a wet chemical etching.

3. The method of claim 1, wherein said trench dielectric liner comprises silicon oxide.

4. The method of claim 2, wherein said wet chemical etching said surface of said trench dielectric liner comprises a hydrofluoric acid (HF) solution etch.

5. The method of claim 3, wherein said second dielectric layer comprises a tetraethyl orthosilicate (TEOS) derived layer of silicon oxide.

6. The method of claim 1, wherein said forming at least one trench comprises forming a termination trench and forming a plurality of active area trenches surrounded by said termination trench, and wherein said etching said second polysilicon layer removes said second polysilicon layer from said termination trench but not from said plurality of active area trenches.

7. The method of claim 6, wherein a depth of said plurality of active area trenches and said termination trench are all between 2 μm and 20 μm.

8. The method of claim 6, wherein said plurality of active area trenches are adjacent to gate electrodes comprising a third polysilicon layer on a gate dielectric.

9. The method of claim 1, wherein said forming said second dielectric layer comprises depositing.

10. The method of claim 1, wherein said semiconductor surface comprises silicon.

11. The method of claim 1, wherein said semiconductor device comprises a discrete n-channel MOSFET.

12. A method of fabricating a semiconductor device, comprising:
- forming a termination trench and forming a plurality of active area trenches surrounded by said termination trench from a top side of a silicon surface,
- lining said termination trench and said plurality of active area trenches with a trench dielectric liner;
- filling said termination trench and said plurality of active area trenches with a first polysilicon layer,
- etching a surface of said trench dielectric liner, wherein dips in said trench dielectric liner are formed relative to a top surface of said first polysilicon layer which form a protrusion comprising said first polysilicon layer in said termination trench;
- etching said first polysilicon layer to remove at least a portion of said protrusion;
- forming a second dielectric layer over at least said termination trench after etching said first polysilicon layer;
- depositing a second polysilicon layer, and
- etching said second polysilicon layer to remove said second polysilicon layer over said termination trench and provide a patterned second polysilicon layer without substantially recessing from said top side of said silicon surface.

* * * * *